(12) United States Patent
Liu et al.

(10) Patent No.: US 12,432,928 B2
(45) Date of Patent: Sep. 30, 2025

(54) VERTICAL TRANSISTOR, INTEGRATED CIRCUITRY, METHOD OF FORMING A VERTICAL TRANSISTOR, AND METHOD OF FORMING INTEGRATED CIRCUITRY

(71) Applicant: Micron Technology, Inc., Boise, ID (US)

(72) Inventors: Hung-Wei Liu, Meridian, ID (US); Vassil N. Antonov, Boise, ID (US); Ashonita A. Chavan, Boise, ID (US); Darwin Franseda Fan, Boise, ID (US); Jeffery B. Hull, Boise, ID (US); Anish A. Khandekar, Boise, ID (US); Masihhur R. Laskar, Boise, ID (US); Albert Liao, Boise, ID (US); Xue-Feng Lin, Boise, ID (US); Manuj Nahar, Boise, ID (US); Irina V. Vasilyeva, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 18/522,637

(22) Filed: Nov. 29, 2023

(65) Prior Publication Data

US 2024/0164114 A1    May 16, 2024

Related U.S. Application Data

(60) Continuation of application No. 17/589,310, filed on Jan. 31, 2022, now Pat. No. 11,871,582, which is a
(Continued)

(51) Int. Cl.
*H10B 53/20* (2023.01)
*H01L 21/223* (2006.01)
(Continued)

(52) U.S. Cl.
CPC ........... *H10B 53/20* (2023.02); *H01L 21/223* (2013.01); *H10B 51/20* (2023.02); *H10B 51/30* (2023.02);
(Continued)

(58) Field of Classification Search
CPC ...... H10D 30/025; H10D 30/63; H10B 51/20; H10B 51/30
See application file for complete search history.

(56) References Cited

U.S. PATENT DOCUMENTS

| | | |
|---|---|---|
| 7,372,091 B2 | 5/2008 | Leslie |
| 10,886,130 B2 * | 1/2021 | Nahar ............... H01L 21/02513 |

(Continued)

FOREIGN PATENT DOCUMENTS

KR    101872926    6/2018

*Primary Examiner* — Steven M Page
(74) *Attorney, Agent, or Firm* — Wells St. John P.S.

(57) ABSTRACT

A method of forming a vertical transistor comprising a top source/drain region, a bottom source/drain region, a channel region vertically between the top and bottom source/drain regions, and a gate operatively laterally-adjacent the channel region comprises, in multiple time-spaced microwave annealing steps, microwave annealing at least the channel region. The multiple time-spaced microwave annealing steps reduce average concentration of elemental-form H in the channel region from what it was before start of the multiple time-spaced microwave annealing steps. The reduced average concentration of elemental-form H is 0.005 to less than 1 atomic percent. Structure embodiments are disclosed.

22 Claims, 2 Drawing Sheets

Related U.S. Application Data division of application No. 17/027,046, filed on Sep. 21, 2020, now Pat. No. 11,264,395.

(51) Int. Cl.
  *H10B 51/20* (2023.01)
  *H10B 51/30* (2023.01)
  *H10B 53/30* (2023.01)
  *H10D 30/01* (2025.01)
  *H10D 30/63* (2025.01)
  *H10D 62/17* (2025.01)

(52) U.S. Cl.
  CPC ........... *H10B 53/30* (2023.02); *H10D 30/025* (2025.01); *H10D 30/63* (2025.01); *H10D 62/292* (2025.01)

(56) References Cited

U.S. PATENT DOCUMENTS

| | | | |
|---|---|---|---|
| 11,264,395 B1* | 3/2022 | Liu | H10B 53/30 |
| 2015/0104923 A1 | 4/2015 | Tsai et al. | |
| 2015/0348909 A1* | 12/2015 | Yamazaki | H10D 86/60 438/638 |
| 2016/0372329 A1* | 12/2016 | Jelinek | H01L 21/26506 |
| 2017/0338334 A1 | 11/2017 | Cheng et al. | |
| 2018/0197988 A1 | 7/2018 | Ratnam et al. | |
| 2019/0206935 A1 | 7/2019 | Kim et al. | |
| 2019/0221481 A1* | 7/2019 | Schulze | H01L 21/304 |
| 2020/0066513 A1* | 2/2020 | Nahar | C23C 16/06 |
| 2020/0119012 A1* | 4/2020 | Rubin | H10D 30/025 |
| 2022/0093617 A1 | 3/2022 | Liu et al. | |
| 2022/0093771 A1 | 3/2022 | Laskar et al. | |

\* cited by examiner

VERTICAL TRANSISTOR, INTEGRATED CIRCUITRY, METHOD OF FORMING A VERTICAL TRANSISTOR, AND METHOD OF FORMING INTEGRATED CIRCUITRY

RELATED PATENT DATA

This patent resulted from continuation application of U.S. patent application Ser. No. 17/589,310, filed Jan. 31, 2022, entitled "Vertical Transistor, Integrated Circuitry, Method Of Forming A Vertical Transistor, And Method Of Forming Integrated Circuitry", naming Hung-Wei Liu, Vassil N. Antonov, Ashonita A. Chavan, Darwin Franseda Fan, Jeffery B. Hull, Anish A. Khandekar, Masihhur R. Laskar, Albert Liao, Xue-Feng Lin, Manuj Nahar, and Irina V. Vasilyeva as inventors, which is a divisional application of U.S. patent application Ser. No. 17/027,046, filed Sep. 21, 2020, entitled "Vertical Transistor, Integrated Circuitry, Method Of Forming A Vertical Transistor, And Method Of Forming Integrated Circuitry", naming Hung-Wei Liu, Vassil N. Antonov, Ashonita A. Chavan, Darwin Franseda Fan, Jeffery B. Hull, Anish A. Khandekar, Masihhur R. Laskar, Albert Liao, Xue-Feng Lin, Manuj Nahar, and Irina V. Vasilyeva as inventors, now U.S. Pat. No. 11,264,395, the disclosures of which are incorporated by reference.

TECHNICAL FIELD

Embodiments disclosed herein pertain to vertical transistors, to integrated circuitry, to methods of forming a vertical transistor, and to methods of forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

DETAILED DESCRIPTION OF EXAMPLE EMBODIMENTS

Figure 1:
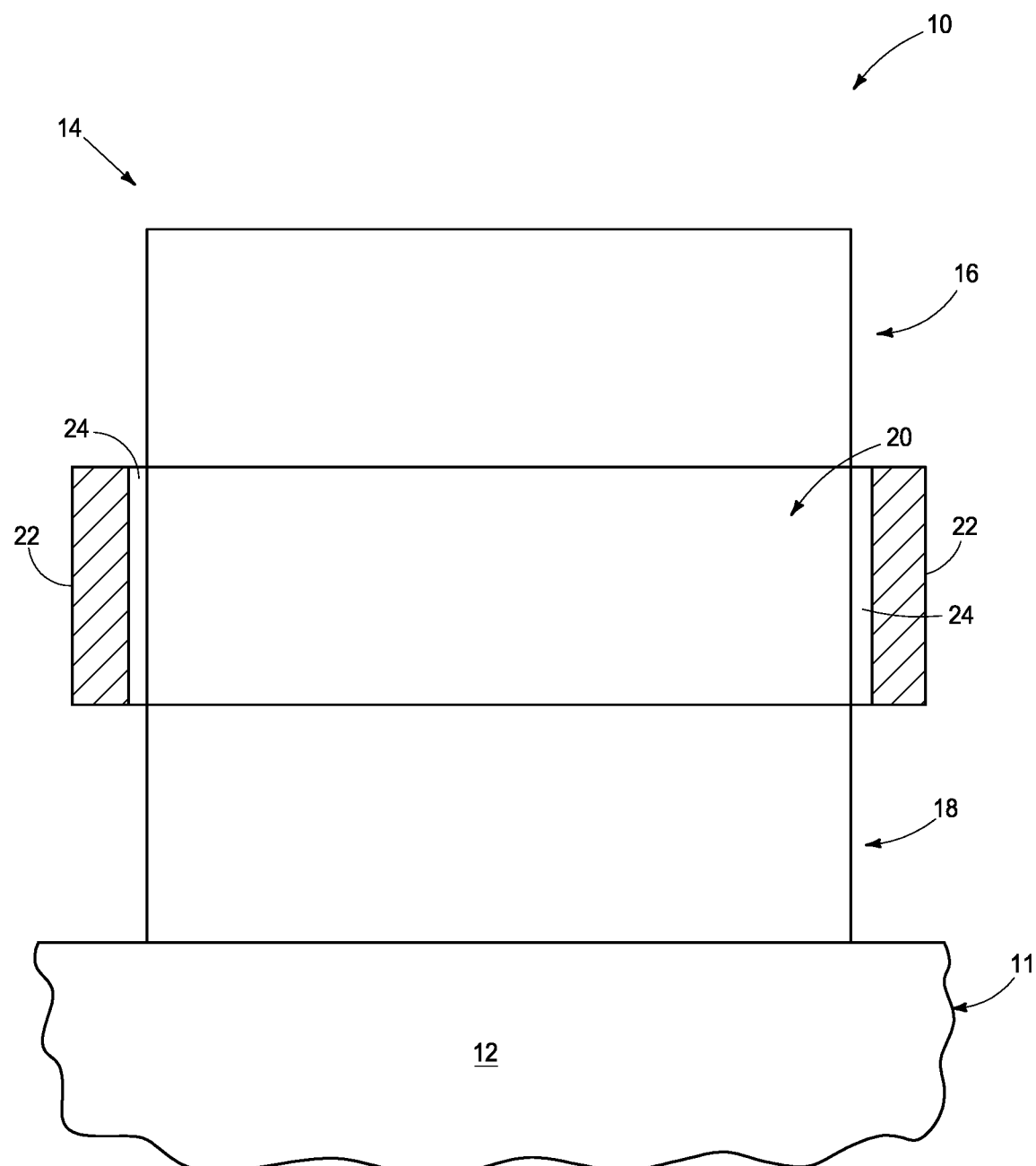
FIG. 1 is a diagrammatic sectional view of a portion of a substrate comprising a vertical transistor in accordance with an embodiment of the invention.

Embodiments of the invention encompass methods of forming integrated circuitry comprising one or more vertical transistors and one or more vertical transistors independent of method of manufacture. Vertical transistors manufactured in accordance with method embodiments may have any of the attributes as described herein in structure embodiments. A first example vertical transistor 14 in accordance with an embodiment of the invention as part of a construction 10 is shown by way of example in FIG. 1. Construction 10 comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Only one vertical transistor 14 is shown, although construction 10 may comprise multiple of the same or different construction vertical transistors, for example fabricated in an array which includes one or more vertical transistors in accordance with the invention.

Vertical transistor 14 comprises a top source/drain region 16, a bottom source/drain region 18, a channel region 20 vertically between top and bottom source/drain regions 16, 18, respectively, and a gate 22 (i.e., conductive material) operatively laterally-adjacent (e.g., laterally-aside) channel region 20. A gate insulator 24 (e.g., silicon dioxide, silicon nitride, high-k material, and/or ferroelectric material) is between gate 22 and channel region 20. The example depicted components for brevity and clarity are only shown in FIG. 1 as a vertical cross-section. The example source/drain regions and channel regions may be, for example, in the form of coextensive longitudinally elongated lines running into and out of the plane of the page upon which FIG. 1 lies. Alternately and by way of example only, such may be circular, rectangular, elliptical, triangular, etc. in horizontal cross-section (not shown). Gate insulator 24 and/or gate 22 may peripherally encircle such structures or alternately, by way of example only, be only partially around such structures or only on one lateral-side in vertical cross-section (not shown). By way of examples only, regions 16, 18, and 20 may comprise one or more of appropriately-doped crystalline semiconductor material, such as one or more silicon, germanium, and so-called III/V semiconductor materials (e.g., GaAs, InP, GaP, and GaN), with source/drain regions 16 and 18 being sufficiently doped to be conductive and channel region 18 being undoped or sufficiently doped to be semiconductive to conduct in an "on" state and to not conduct in an "off" state of the transistor.

Channel region 18 has an average concentration of elemental-form H of 0.005 to less than 1 atomic percent, in one embodiment an average concentration of elemental-form H of no more than 0.5 atomic percent, in one embodiment an average concentration of elemental-form H of no more than 0.25 atomic percent, in one embodiment an average concentration of elemental-form H of no more than 0.1 atomic percent, and in one embodiment an average concentration of elemental-form H of no more than 0.01 atomic percent. In one embodiment, all of channel region 18 has the concentration of elemental-form H of 0.005 to less than 1 atomic percent. In one embodiment, channel region 18 comprises silicon. Elemental-form H may be introduced in a manufacturing process in which vertical transistor 14 is formed, for example from deposition gases comprising compounds or species having hydrogen atoms therein. Some presence of elemental-form H may be beneficial to operation of a vertical transistor, but concentrations of 1 atomic or more are adverse and, regardless, may create undesired void spaces in channel region 18 upon heating.

Any other attribute(s) or aspect(s) as shown and/or described herein with respect to other embodiments may be used in the embodiments shown and described with reference to the above embodiments.

Figure 2:
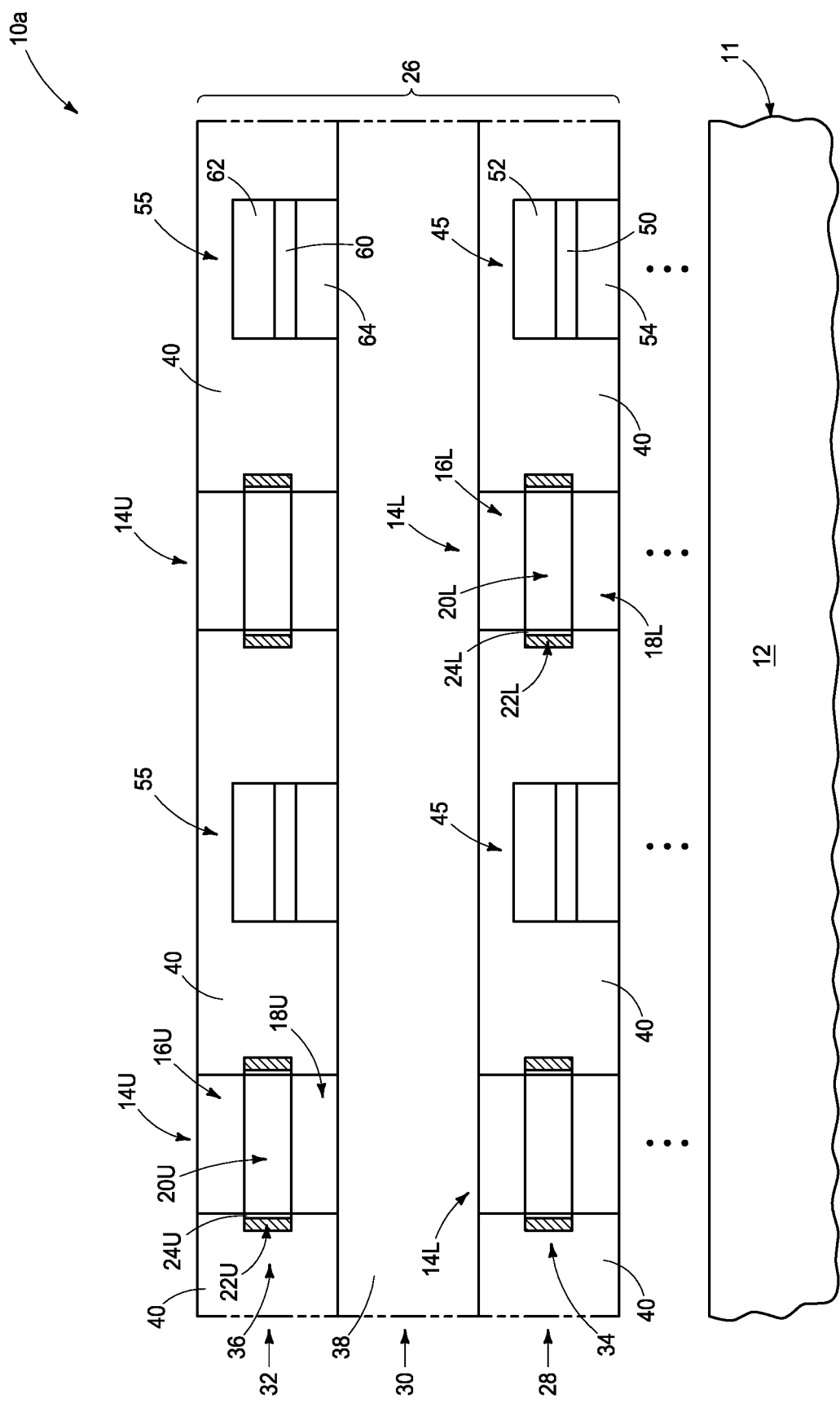
FIG. 2 is a is a diagrammatic sectional view of a portion of a substrate comprising integrated circuitry in accordance with an embodiment of the invention.

Embodiments of the invention encompass integrated circuitry, for example as shown with respect to a construction 10a in FIG. 2. Like numerals from the above-described embodiments have been used where appropriate, with some differences from construction 10 being indicated with the suffix "a", "L", "U", or with different numerals. Construction 10a comprises an example stack 26 comprising tiers 28, 30, and 32. Construction 10a may have more tiers than shown. The integrated circuitry of construction 10a comprises a lower array 34 comprising vertical transistors 14L. Such transistors individually comprise a lower-array top source/drain region 16L, a lower-array bottom source/drain region 18L, a lower-array channel region 20L vertically between the lower-array top and bottom source/drain regions, and a lower-array gate 22L operatively laterally-adjacent lower-array channel region 20L. Regions 18L, 16L, 20L, and 22L of lower-array vertical transistors 14L may have any of the attributes described above with respect to 18, 16, 20, and 22, respectively.

Integrated circuitry of construction 10a comprises an upper array 36 of vertical transistors 14U spaced above lower array 34 of vertical transistors 14L. Upper-array vertical transistors 14U individually comprise an upper-array top source/drain region 16U, an upper-array bottom source/drain region 18U, an upper array channel region 20U vertically between the upper-array top and bottom source/drain regions, and an upper-array gate 22U operatively laterally adjacent upper-array channel region 20U. Regions 18U, 16U, 20U, and 22U of upper-array vertical transistors 14U may have any of the attributes described above with respect to 18, 16, 20, and 22, respectively. Insulating material 38 (e.g., silicon dioxide and/or silicon nitride) is vertically between and spaces lower array 34 and upper array 36 relative one another (e.g., being a tier 30 separating tiers 28 and 32). Example tiers 28 and 32 are shown as comprising insulative material 40 that may be the same or different composition as insulating material 38.

Lower-array channel regions 20L and upper-array channel regions 20U individually have an average concentration of elemental-form H of 0.005 to less than numeral 1 atomic percent.

In one embodiment, the integrated circuitry of construction 10a comprises a lower-array gate insulator 24L laterally-between lower-array channel region 20L and lower-array gate 22L. Further, lower array 34 comprises capacitors 45 individually comprising a lower-array capacitor insulator 50 (e.g., silicon dioxide, silicon nitride, high-k material, and/or ferroelectric material) between a pair of lower-array capacitor electrodes 52, 54. In such embodiment, the integrated circuitry comprises at least one of (a) and (b), where:
  (a) at least one of the lower-array vertical transistors having its lower-array gate insulator comprising a metal oxide, where the metal is one or more of Pb, Zr, Hf, Ru, and Ti; and
  (b) at least one of the lower-array capacitors having its lower-array capacitor insulator comprising the metal oxide.

In one embodiment, the integrated circuitry comprises (a), in one embodiment comprises (b), and in one embodiment comprises both (a) and (b).

In one embodiment, the integrated circuitry of construction 10a comprises an upper-array gate insulator 24U laterally-between upper-array channel region 20U and upper-array gate 22U. Further, upper array 36 comprises capacitors 55 individually comprising an upper-array capacitor insulator 60 between a pair of upper-array capacitor electrodes 62, 64. Upper-array capacitors 55 may be of the same construction as or of different construction from lower-array capacitors 45. Regardless, in this embodiment, the integrated circuitry comprises at least one of (c) and (d), where:

(c) at least one of the upper-array vertical transistors having its upper-array gate insulator comprising the metal oxide; and (d) at least one of the upper-array capacitors having its upper-array capacitor insulator comprising the metal oxide.

In one embodiment, the integrated circuitry comprises (c), in one embodiment comprises (d), and in one embodiment, comprises both (c) and (d).

In one embodiment, lower-array channel region 20L comprises a metal oxide where the metal is one or more of In, Ga, and Zn, and in one embodiment consists essentially of such metal oxide. In one embodiment, upper-array channel regions 20U comprise the metal oxide, and in one such embodiment consists essentially of such metal oxide.

In one embodiment, lower array 34 comprises at least some electronic components that comprise at least one of a metal oxide, a metal nitride, or a metal chalcogenide other than a metal oxide, with the metal of said metal oxide, metal nitride, or metal chalcogenide being one or more of Zr, Hf, Al, Ta, Nb, Ni, Co, In, Ge, Sb, Be, Ti, Zn, and Ga. Such electronic components may be any existing or future-developed components, for example transistors, capacitors, diodes, thyristors, memristors, etc., including one or more of the transistors and/or capacitors shown in FIG. 2. In one such embodiment, upper array 36 also comprises at least some electronic components that comprise at least one of the metal oxide, the metal nitride, or the metal chalcogenide other than a metal oxide.

In one embodiment, upper-array vertical transistors 14U and lower-array vertical transistors 14L individually comprise a memory cell. For example, and by way of example only, one of capacitor electrodes 52 or 54 could be directly electrically coupled with one of source/drain regions 18L or 16L (not shown) forming an individual memory cell (not shown) comprising one capacitor and one transistor. The same may apply with respect to upper-array vertical transistors 14U and capacitor electrodes 52 or 54 and source/drain regions 18U or 16U. Alternately, and by way of example only, the gate insulators of one or both of transistors 14L and 14U could be ferroelectric and may, for example, form non-volatile memory cells in the absence of any separate/additional capacitor.

The various components described above could interconnect relative one another intra-tier and/or inter-tier (not shown) and conductive vias (not shown) could extend through one or more of such layers to connect with circuitry above and/or below (not shown).

Any other attribute(s) or aspect(s) as shown and/or described herein with respect to other embodiments may be used.

Embodiments of the invention comprise methods used in forming integrated circuitry comprising vertical transistors and comprise methods of forming a vertical transistor. Vertical transistors formed in accordance with method embodiments may have any of the attributes described above with respect to structure embodiments. Structure embodiments of vertical transistors may have any of the attributes described below with respect to method embodiments. In one embodiment, a method includes forming a vertical transistor (e.g. 14) comprising a top source/drain region (e.g. 16), a bottom source/drain region (e.g. 18), a channel region (e.g. 20) vertically between the top and bottom source/drain regions, and a gate (e.g. 22) operatively laterally-adjacent channel region 20. Multiple time-spaced microwave annealing steps are conducted to microwave anneal at least the channel region. The multiple time-spaced microwave annealing steps reduce average concentration of elemental-form H in the channel region from what it was before start of the multiple time-spaced microwave annealing steps. The reduced average concentration of elemental-form H is 0.005 to less than 1 atomic percent.

The artisan is capable of selecting suitable microwave power levels and number of time-spaced steps to achieve the elemental-form H concentration reduction and to be 0.005 to less than 1 atomic percent. The time-spaced microwave annealing steps may be at the same power level relative one another or may be at two or more different power levels relative one another. Further, power level need not be constant during the time-spaced microwave annealing steps. The time-spaced microwave annealing steps may be of the same time length relative one another or may be of two or more different time lengths relative one another. Further, the time between the stated microwave annealing steps may be the same relative one another or may be of two or more different time lengths relative one another. In some embodiments, microwave power between immediately-adjacent of the time-spaced microwave annealing steps is still applied but reduced from the time-spaced microwave annealing steps and in another embodiment, microwave power between immediately-adjacent of the time-spaced microwave annealing steps is 0 watts. By way of examples only, microwave power during the cyclic microwave annealing is 100 watts to 20,000 watts, time length bet ween immediately-time-adjacent annealing steps is 1 second to 1 hour, and microwave power between immediately-time-adjacent annealing steps is 0 watts to some value below what the minimum power was during the immediately-time-adjacent annealing steps (e.g., below 100 watts between immediately-time-adjacent annealing steps.

In one embodiment, the channel region is upwardly exposed during the multiple time-spaced microwave annealing steps, for example before the material of upper source/drain region 16 has been formed. Alternately as an example, the channel region has its top covered by material during the multiple time-spaced microwave annealing steps, for example such not occurring until after material of upper source/drain region 16 has been formed.

In one embodiment, temperature of the channel region and of material that is below the channel region never exceeds 450° C. during all the multiple time-spaced microwave annealing steps, in one embodiment never falls below 300° C. during all the multiple time-spaced annealing steps (i.e., after initially reaching 300° C. if the substrate is below that temperature at start of the annealing steps), and in one embodiment is from 300° C. to 450° C. during all of the multiple time-spaced microwave annealing steps.

In one embodiment, the reducing of concentration of elemental-form H in the channel region is by at least 10 percent, in one embodiment by a factor of at least 2 times, in one embodiment by a factor of at least 10 times, in one embodiment by a factor of at least 100 times, and in one embodiment by a factor of at least 200 times.

Any other attribute(s) or aspect(s) as shown and/or described herein with respect to other embodiments may be used.

In one embodiment, a method includes forming integrated circuitry comprising a lower array (e.g., 34) comprising vertical transistors (e.g., 14L) that individually comprise a lower-array top source/drain region (e.g., 16L), a lower-array bottom source/drain region (e.g., 18L), a lower-array channel region (e.g., 20L) vertically between the lower-array top and bottom source/drain regions, and a lower-array gate (e.g., 22L) operatively laterally-adjacent the lower-array channel region. Also formed is an upper array (e.g., 36) of vertical transistors (e.g., 14U) spaced above the lower array of vertical transistors. The lower-array vertical transistors individually comprise an upper-array top source/drain region (e.g., 16U), an upper-array bottom source/drain region (e.g., 18U), an upper-array channel region (e.g., 20U) vertically between the upper-array top and bottom source/drain regions, and an upper-array gate (e.g., 22U) operatively laterally-adjacent the upper-array channel region. Insulating material (e.g., 38) is vertically between and spaces the lower and upper arrays relative one another. Such method also comprises, in multiple time-spaced microwave annealing steps, microwave annealing at least the upper-array channel region. The multiple time-spaced microwave annealing steps reduce average concentration of elemental-form H in the upper-array channel region from what it was before start of the multiple time-spaced microwave annealing steps, with the reduced average concentration of elemental-form H being 0.005 to less than 1 atomic percent. Such multiple time-spaced annealing steps may also be applied to the lower-array channel region. Any other attribute(s) or aspect(s) as shown and/or described herein with respect to other embodiments may be used.

The above processing(s) or construction(s) may be considered as being relative to an array of components formed as or within a single stack or single deck or within two stacks or two decks of such components above or as part of an underlying base substrate (albeit, the single stack/deck and/or two stacks/decks may each have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a vertical transistor comprises a top source/drain region, a bottom source/drain region, a channel region vertically between the top and bottom source/drain regions, and a gate operatively laterally-adjacent the channel region. The channel region has an average concentration of elemental-form H of 0.005 to less than 1 atomic percent.

In some embodiments, integrated circuitry comprising a lower array comprises vertical transistors. The lower-array vertical transistors individually comprise a lower-array top source/drain region, a lower-array bottom source/drain region, a lower-array channel region vertically between the lower-array top and bottom source/drain regions, and a lower-array gate operatively laterally-adjacent the lower-array channel region. An upper array of vertical transistors is spaced above the lower array of vertical transistors. The upper-array vertical transistors individually comprise an upper-array top source/drain region, an upper-array bottom source/drain region, an upper-array channel region vertically between the upper-array top and bottom source/drain regions, and an upper-array gate operatively laterally-adjacent the upper-array channel region. Insulating material is vertically between and spaces the lower and upper arrays relative one another. The lower-array channel regions and the upper-array channel regions individually have an average concentration of elemental-form H of 0.005 to less than 1 atomic percent.

In some embodiments, a method of forming a vertical transistor comprising a top source/drain region, a bottom source/drain region, a channel region vertically between the top and bottom source/drain regions, and a gate operatively laterally-adjacent the channel region comprises, in multiple time-spaced microwave annealing steps, microwave annealing at least the channel region. The multiple time-spaced microwave annealing steps reduce average concentration of elemental-form H in the channel region from what it was before start of the multiple time-spaced microwave annealing steps. The reduced average concentration of elemental-form H is 0.005 to less than 1 atomic percent.

In some embodiments, a method of forming integrated circuitry comprises forming a lower array comprises vertical transistors. The lower-array vertical transistors individually comprise a lower-array top source/drain region, a lower-array bottom source/drain region, a lower-array channel region vertically between the lower-array top and bottom source/drain regions, and a lower-array gate operatively laterally-adjacent the lower-array channel region. An upper array of vertical transistors is spaced above the lower array of vertical transistors. The lower-array vertical transistors individually comprise an upper-array top source/drain region, an upper-array bottom source/drain region, an upper-array channel region vertically between the upper-array top and bottom source/drain regions, and an upper-array gate operatively laterally-adjacent the upper-array channel region. Insulating material is vertically between and space the lower and upper arrays relative one another. The method comprises, in multiple time-spaced microwave annealing steps, microwave annealing at least the upper-array channel region. The multiple time-spaced microwave annealing steps reduce average concentration of elemental-form H in the upper-array channel region from what it was before start of the multiple time-spaced microwave annealing steps. The reduced average concentration of elemental-form H is 0.005 to less than 1 atomic percent.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising:
   a substrate comprising insulative material;
   a lower array above the substrate, the lower array comprising vertical transistors; the lower-array vertical transistors individually comprising a lower-array top source/drain region, a lower-array bottom source/drain region, a lower-array channel region vertically between the lower-array top and bottom source/drain regions, and a lower-array gate operatively laterally-adjacent the lower-array channel region;

an upper array of vertical transistors spaced above the lower array of vertical transistors, the upper-array vertical transistors individually comprising an upper-array top source/drain region, an upper-array bottom source/drain region, an upper-array channel region vertically between the upper-array top and bottom source/drain regions, and an upper-array gate operatively laterally-adjacent the upper-array channel region;

insulating material vertically between and spacing the lower and upper arrays relative one another;

the lower-array channel regions and the upper-array channel regions individually having an average concentration of elemental-form H of 0.005 to less than 1 atomic percent;

a lower-array gate insulator laterally-between the lower-array channel region and the lower-array gate;

the lower array comprising capacitors individually comprising a lower-array capacitor insulator between a pair of lower-array capacitor electrodes; and at least one of (a) and (b), where:
(a): at least one of the lower-array vertical transistors having its lower-array gate insulator comprising a metal oxide, where the metal is one or more of Pb, Zr, Hf, Ru, and Ti; and
(b): at least one of the lower-array capacitors having its lower-array capacitor insulator comprising the metal oxide.

2. The integrated circuitry of claim 1 where the metal comprises Pb.

3. The integrated circuitry of claim 1 where the metal comprises Zr.

4. The integrated circuitry of claim 1 where the metal comprises Hf.

5. The integrated circuitry of claim 1 where the metal comprises Ru.

6. The integrated circuitry of claim 1 where the metal comprises Ti.

7. Integrated circuitry comprising:
a substrate comprising insulative material;
a lower array above the substrate, the lower array comprising vertical transistors; the lower-array vertical transistors individually comprising a lower-array top source/drain region, a lower-array bottom source/drain region, a lower-array channel region vertically between the lower-array top and bottom source/drain regions, and a lower-array gate operatively laterally-adjacent the lower-array channel region;
an upper array of vertical transistors spaced above the lower array of vertical transistors, the upper-array vertical transistors individually comprising an upper-array top source/drain region, an upper-array bottom source/drain region, an upper-array channel region vertically between the upper-array top and bottom source/drain regions, and an upper-array gate operatively laterally-adjacent the upper-array channel region;
insulating material vertically between and spacing the lower and upper arrays relative one another; and
the lower-array channel regions and the upper-array channel regions individually having an average concentration of elemental-form H of 0.005 to less than 1 atomic percent; and
the lower array comprising at least some electronic components that comprise at least one of a metal oxide, a metal nitride, or a metal chalcogenide other than a metal oxide; the metal of said metal oxide, metal nitride, or metal chalcogenide being one or more of Zr, Hf, Al, Ta, Nb, Ni, Co, In, Ge, Sb, Be, Ti, Zn, and Ga.

8. The integrated circuitry of claim 7 wherein the upper array comprises at least some electronic components that comprise at least one of the metal oxide, the metal nitride, or the metal chalcogenide other than a metal oxide.

9. The integrated circuitry of claim 7 wherein the metal of said metal oxide, metal nitride, or metal chalcogenide comprises Zr.

10. The integrated circuitry of claim 7 wherein the metal of said metal oxide, metal nitride, or metal chalcogenide comprises Hf.

11. The integrated circuitry of claim 7 wherein the metal of said metal oxide, metal nitride, or metal chalcogenide comprises Al.

12. The integrated circuitry of claim 7 wherein the metal of said metal oxide, metal nitride, or metal chalcogenide comprises Ta.

13. The integrated circuitry of claim 7 wherein the metal of said metal oxide, metal nitride, or metal chalcogenide comprises Nb.

14. The integrated circuitry of claim 7 wherein the metal of said metal oxide, metal nitride, or metal chalcogenide comprises Ni.

15. The integrated circuitry of claim 7 wherein the metal of said metal oxide, metal nitride, or metal chalcogenide comprises Co.

16. The integrated circuitry of claim 7 wherein the metal of said metal oxide, metal nitride, or metal chalcogenide comprises In.

17. The integrated circuitry of claim 7 wherein the metal of said metal oxide, metal nitride, or metal chalcogenide comprises Ge.

18. The integrated circuitry of claim 7 wherein the metal of said metal oxide, metal nitride, or metal chalcogenide comprises Sb.

19. The integrated circuitry of claim 7 wherein the metal of said metal oxide, metal nitride, or metal chalcogenide comprises Be.

20. The integrated circuitry of claim 7 wherein the metal of said metal oxide, metal nitride, or metal chalcogenide comprises Ti.

21. The integrated circuitry of claim 7 wherein the metal of said metal oxide, metal nitride, or metal chalcogenide comprises Zn.

22. The integrated circuitry of claim 7 wherein the metal of said metal oxide, metal nitride, or metal chalcogenide comprises Ga.

* * * * *